United States Patent
Hayashi et al.

(10) Patent No.: US 10,231,370 B2
(45) Date of Patent: Mar. 12, 2019

(54) ELECTRONIC COMPONENT MOUNTING DEVICE

(71) Applicant: FUJI CORPORATION, Chiryu (JP)

(72) Inventors: Tetsuo Hayashi, Anjo (JP); Kuniyasu Nakane, Okazaki (JP); Chikashi Teshima, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 308 days.

(21) Appl. No.: 14/908,438

(22) PCT Filed: Jul. 31, 2013

(86) PCT No.: PCT/JP2013/070679
§ 371 (c)(1),
(2) Date: Jan. 28, 2016

(87) PCT Pub. No.: WO2015/015578
PCT Pub. Date: Feb. 5, 2015

(65) Prior Publication Data
US 2016/0174425 A1    Jun. 16, 2016

(51) Int. Cl.
*H05K 13/04* (2006.01)
*H05K 13/08* (2006.01)
(Continued)

(52) U.S. Cl.
CPC ......... *H05K 13/0404* (2013.01); *H05K 3/303* (2013.01); *H05K 9/0032* (2013.01);
(Continued)

(58) Field of Classification Search
CPC .. H05K 13/046; H05K 13/0404; H05K 13/08; H05K 3/303; H05K 9/0032; H05K 9/0035; Y10T 29/53174; Y10T 29/53252
See application file for complete search history.

(56) References Cited

U.S. PATENT DOCUMENTS 6,051,781 A * 4/2000 Bianca ................. H05K 9/0035
174/250

FOREIGN PATENT DOCUMENTS

JP          11-26978 A        1/1999
JP       2007134893 A    *   5/2007
(Continued)

OTHER PUBLICATIONS

Extended European Search Report dated Jan. 30, 2017 in Patent Application No. 13890685.4.
(Continued)

*Primary Examiner* — A. Dexter Tugbang
(74) *Attorney, Agent, or Firm* — Oblon, McClelland, Maier & Neustadt, L.L.P.

(57) ABSTRACT

An electronic component mounting device, including: a board conveyance device which conveys and positions a board on which an electronic component is mounted; a mounting device which positions and mounts the electronic component to a mounting position of the board; a loading device which picks up multiple engaged members (clips), and positions and loads the engaged members to a loading position of the board; and a placing device which picks up a cover component that covers the mounted electronic component and that is provided with an engaging portion at a predetermined position, and positions and places the cover component to a position such that the engaging portion corresponds to the engaged member.

7 Claims, 11 Drawing Sheets

(51) Int. Cl.
    *H05K 9/00*     (2006.01)
    *H05K 3/30*     (2006.01)

(52) U.S. Cl.
    CPC ......... *H05K 9/0035* (2013.01); *H05K 13/046* (2013.01); *H05K 13/08* (2013.01); *Y10T 29/53174* (2015.01); *Y10T 29/53252* (2015.01)

(56) References Cited

FOREIGN PATENT DOCUMENTS

| | | |
|---|---|---|
| JP | 2011-66041 A | 3/2011 |
| JP | 2012-222035 A | 11/2012 |

OTHER PUBLICATIONS

International Search Report dated Sep. 3, 2013 in PCT/JP2013/070679 filed Jul. 31, 2013.
Office Action dated Jun. 28, 2017 in Japanese Patent Application No. 2015-529260 (with unedited computer generated English translation).

\* cited by examiner

ELECTRONIC COMPONENT MOUNTING DEVICE

TECHNICAL FIELD

The present disclosure relates to an electronic component mounting device and a mounting method in which a cover component which covers an electronic component mounted on a board is pressed and attached to the board.

BACKGROUND ART

Among electronic components mounted by electronic component mounting devices, there are electronic components which are likely to be influenced by electromagnetic waves or heat, and, in order to prevent such influences, in recent years, for mobile phones and personal computers, the use of shield covers assembled to a board and chassis mounting has increased.

In PTL 1, an electronic component mounting method for positioning and placing one cover component with respect to one frame member on a board is described.

CITATION LIST

Patent Literature

PTL 1: JP-A-2012-222035

SUMMARY

However, in the above-described PTL 1, one frame member is installed on a board surrounding the electronic component to be covered. Here, in order to perform production with good efficiency, when the frame member is positioned and loaded by the electronic component mounting device, a loading device provided with a large nozzle or a chuck which can pick up the frame member is necessary. This causes a problem when trying to make the electronic component mounting device efficient while saving space.

The present disclosure solves the above problem in the related art, and an object thereof is to provide an electronic component mounting device and a mounting method in which a clip and a cover member can be loaded/placed by the electronic component mounting device, by using the clip instead of the frame member of PTL 1.

In order to solve the above-described problem, according to a configuration of the disclosure, there is provided an electronic component mounting device, including: a board conveyance device which conveys and positions a board on which an electronic component is mounted; a mounting device which positions and mounts the electronic component to a mounting position of the board; a loading device which picks up multiple engaged members, and positions and loads the engaged members to a loading position of the board; and a placing device which picks up a cover component that covers the mounted electronic component and that is provided with an engaging portion at a predetermined position, and positions and places the cover component to a position such that the engaging portion corresponds to the engaged member.

EFFECTS

According to the disclosure, it is possible to provide a space-saving and highly efficient electronic component mounting device and mounting method.

DESCRIPTION OF EMBODIMENTS

Figure 1:
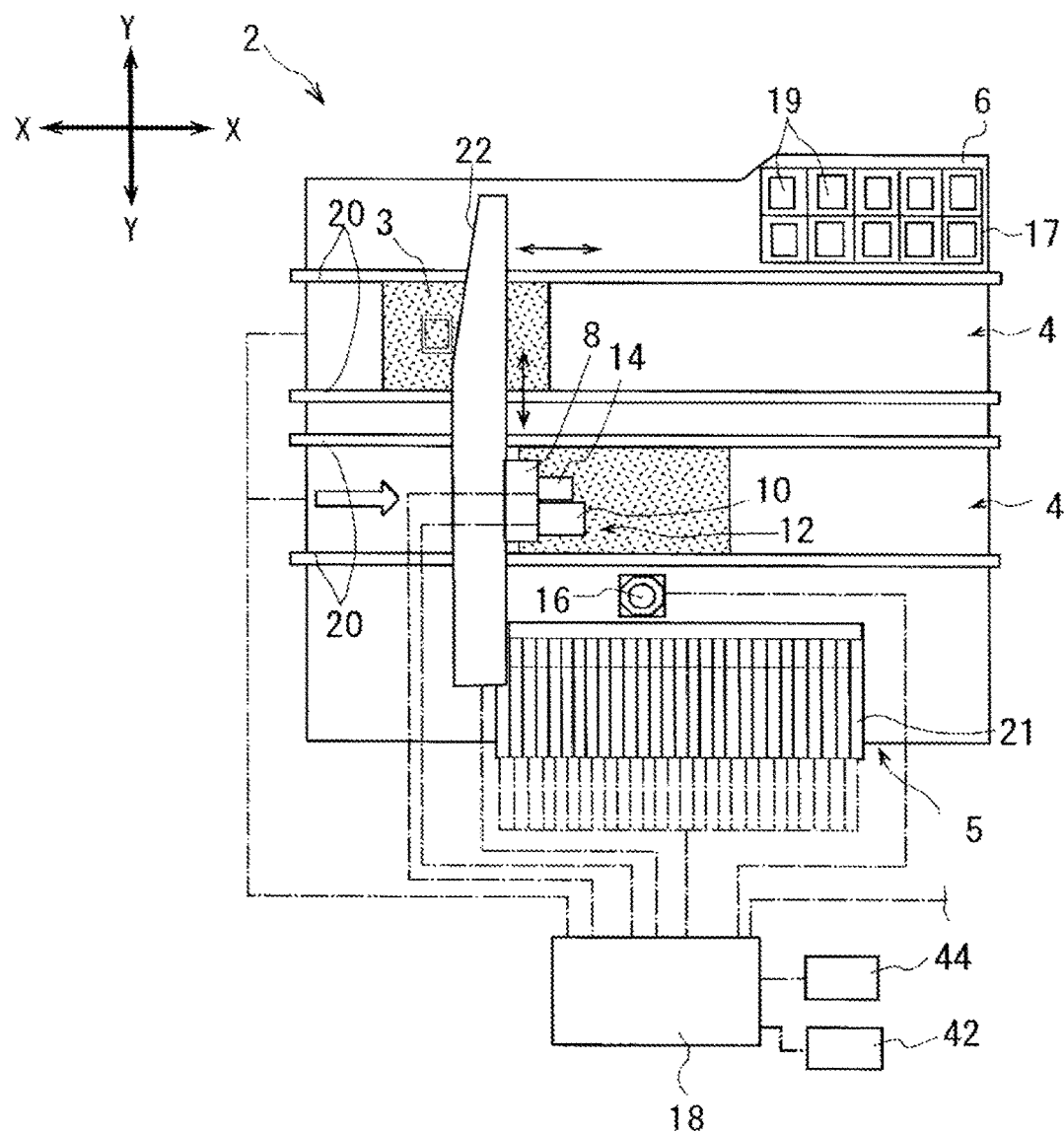
FIG. 1 is a plan view schematically illustrating an electronic component mounting device according to an embodiment.

Hereinafter, an embodiment of an electronic component mounting device which performs an electronic component mounting method according to the disclosure will be described based on the drawings. As illustrated in FIG. 1, electronic component mounting device 2 includes: board conveyance device 4 which conveys board 3 to a conveying position and positions board 3 to a predetermined position; component supply device 5, component transfer device 12 which has mounting head 10 provided on movable base 8 supported to be movable in an X direction and a Y direction which are horizontal directions with respect to base 6, mark recognition camera 14, component recognition. camera 16 fixed to base 6, and control device 18 which controls the mounting by component transfer device 12.

Board conveyance device 4 is a so-called double conveyor, and each conveyor respectively includes conveyor belts (not illustrated) which are installed to be parallel along guide rail 20 that extends in the X direction, convey board 3 to a positioning position, and are provided to be parallel with each other, supporting frames (not illustrated) which respectively support the conveyed board 3, a raising and lowering device not illustrated) which raises to a position (predetermined position) at which mounting is performed on the supported board 3, and a clamping device (not illustrated) which clamps board 3 at a position (mounting position) at which mounting is performed on board 3.

Component supply device o is configured to accommodate multiple cassette type feeders 21 parallel with each other at a side portion (near side in FIG. 1) of board conveyance device 4. Each of the cassette type feeders 21 includes a detachable case portion attached to a slot which is not illustrated, a supply reel provided in a rear portion of the case portion, and a component pick-up portion provided at an end of the case portion. A long, thin tape (not illustrated) in which electronic components 40 (refer to FIG. 6) are each sealed at a predetermined pitch is wound around the supply reel, the tape is drawn out by a sprocket (not illustrated) at a predetermined. pitch, and the electronic components 40 are released from a sealed state and are sequentially fed to the component pick-up portion. A code (identification code) is affixed to cassette type feeder 21, and data corresponding to the code and ID, component number, quantity of sealed components, weight and so on of electronic component 40, is recorded in advance in mounting program data transferred from a host computer (not illustrated) that manages the entire line to control device 18. Component tray 17 is disposed in a side portion (upper portion side in FIG. 1) of board conveyance device 4, and large electronic components or cover components 19 are accommodated in component tray 17. In addition, similar to the electronic component 40, clips 100 are also supplied.

X-direction moving beam 22 is provided above hoard conveyance device 4, and X-direction moving beam 22 extends in the Y direction and is provided to be movable along an X-direction rail (not illustrated) that extends in The X direction along the board conveyance device 4. As illustrated in FIG. 1, in X-direction moving beam 22, movable base 8 is provided to be movable via a slider (not illustrated) on a Y-direction rail (not illustrated) provided on a side surface of the X-direction moving beam 22. Component transfer device 12 provided with mounting head 10, and mark recognition camera 14 are held on movable base 8 to be movable together with movable base 8. X-direction moving beam 22 is driven by a servo motor which is not illustrated via a ball screw mechanism which is not illustrated, and movable base 8 is driven by a servo motor which is not illustrated via a Y-direction movement ball screw mechanism which is not illustrated. The servo motors are controlled to be driven by control device 18.

An optical axis of mark recognition camera 14 is parallel to a Z direction which is perpendicular to the X direction and the Y direction.

An image captured by the mark recognition camera 14 is input to an image recognition device not illustrated which is provided with an A/D converter not illustrated. The image recognition device takes in the captured image, and reads information from a reference mark m (refer to FIG. 6). In addition, the positional shift of the reference mark m is calculated by a calculating device (not illustrated) provided in control device 18. Next, when mark recognition camera 14 is moved, mark recognition camera 14 is moved correcting for the positional shift.

Figure 2:
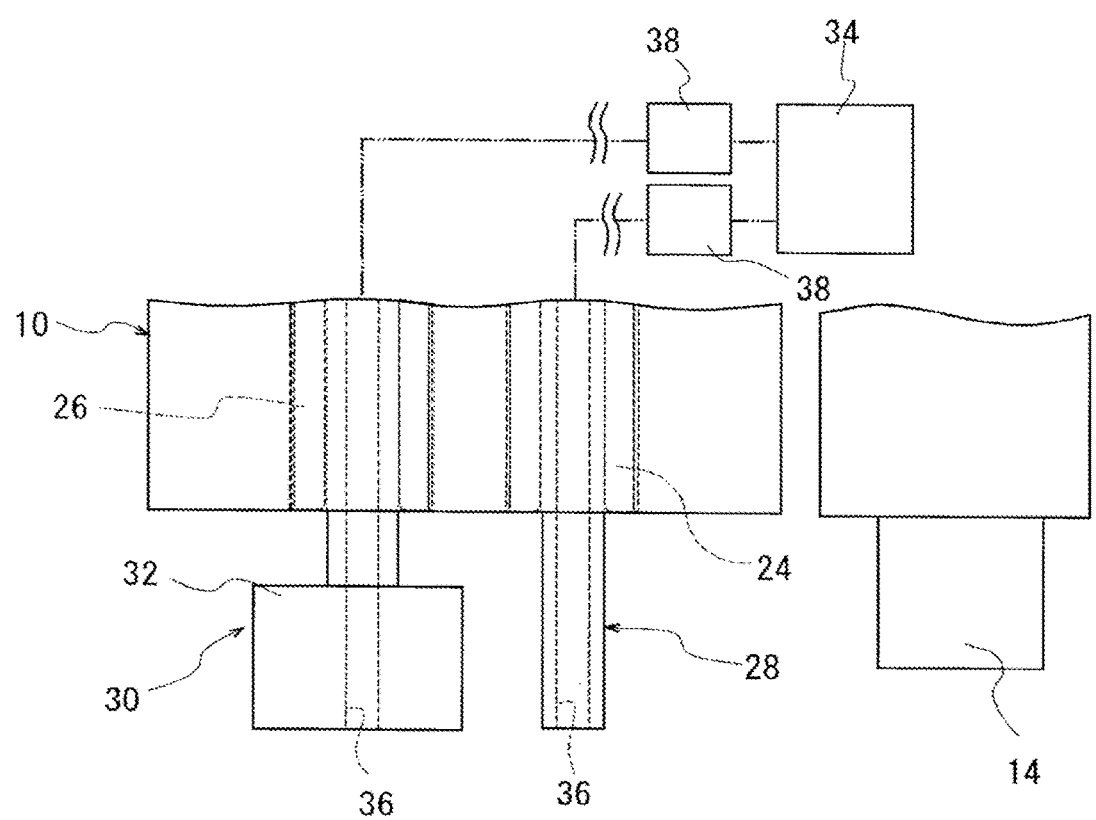
FIG. 2 is a view schematically illustrating a component transfer device and a vertical motion member.

Component transfer device 12 includes movable base 8, a mounting head lifting and lowering device (not illustrated) supported on movable base 8 so as to be capable of being raised and lowered in the Z direction which is perpendicular to the X direction and the Y direction, and mounting head 10 which is supported on the mounting head raising and lowering device. As illustrated in FIG. 2, in mounting head 10, one pair of nozzle holders 24 and 26 is provided, and each of the nozzle holders 24 and 26 is respectively supported to be rotatable in an axial direction by a bearing which is not illustrated. In addition, the nozzle holders 24 and 26 are supported to be vertically movable by a guide member which is not illustrated. Each of the nozzle holders 24 and 26 is respectively driven to be vertically moved by a nozzle holder raising and lowering device (not illustrated) driven by a servo motor which is not illustrated. In addition, nozzle holders 24 and 26 are driven to be rotated around a center axis by a rotation driving mechanism which is not illustrated, and by a servo motor which is not illustrated and drives the rotation driving mechanism.

Axis-like suction nozzles 28 and 30 are respectively inserted into each of the nozzle holders 24 and 26 to be engageable and disengageable. As illustrated in FIG. 2, on one of the suction nozzles 28 and 30, rectangular pressing portion 32 is formed on a lower end portion. At a lower end of pressing portion 32, a negative pressure flow path 36 which communicates with a negative pressure supply pump 34 which is a negative pressure source is open. Electromagnetic valve 38 is provided between negative pressure flow path 36 and negative pressure supply pump 34, and connecting and blocking of negative pressure air from negative pressure supply pump 34 with respect to negative pressure flow path 36 are possible by electromagnetic valve 38. Operation of electromagnetic valve 38 is controlled by control device 18. Electronic component 40 or the like are picked up and held on the opening of negative pressure flow path 36 of suction nozzle 30 and the end of suction nozzle 28 by supplying negative pressure air. A vertical motion member is configured of nozzle holders 24 and 26 and the suction nozzles 28 and 30.

Component recognition camera 16 is provided between board conveyance device 4 and component supply device 5; an image of electronic component 40 picked up by the suction nozzles 28 and 30 is captured by component recognition camera 16, and it is determined whether the type of the electronic component is appropriate for the type of the board to be produced, whether the pickup state is good, and whether there is a defect in the component itself. Similar operations are also performed with respect to clip 100 and cover component 19.

In electronic component mounting device 2, input device 42, such as a keyboard for inputting board data or component data, is provided. Display device 44 is installed together with input device 42, and the board data, the component data, the calculation data, or the image captured by mark recognition camera 14 or the like can be displayed on a screen of display device 44.

Figure 3:
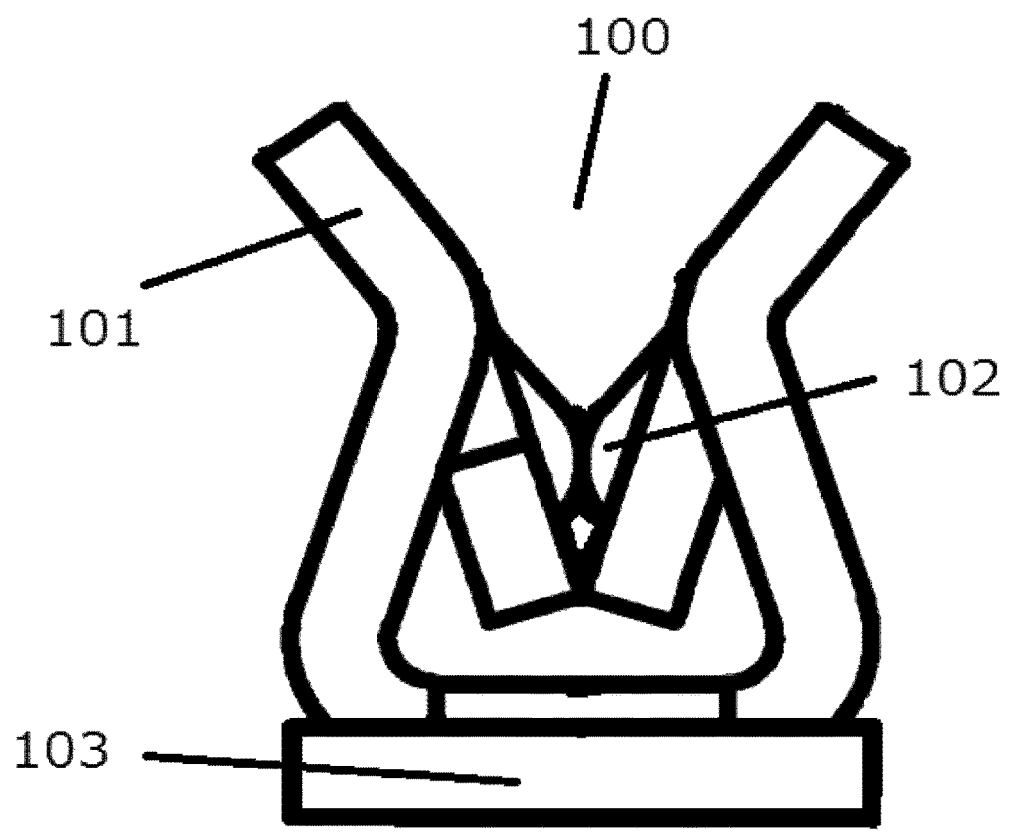
FIG. 3 is a side view of a clip.
Figure 4:
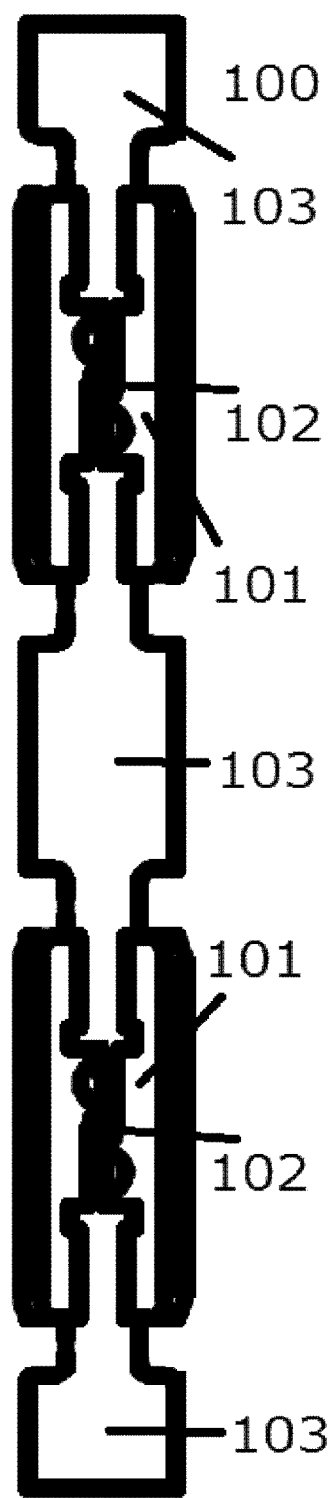
FIG. 4 is the clip viewed from above.

Clip 100 used in the embodiment is made, for example, of metal, such as a copper alloy or an aluminum alloy, and as illustrated in FIGS. 3 and 4, cover component-oriented opening portion 101, cover component nipping portion 102, and board loading surface 103 are formed on clip 100.

Figure 5:
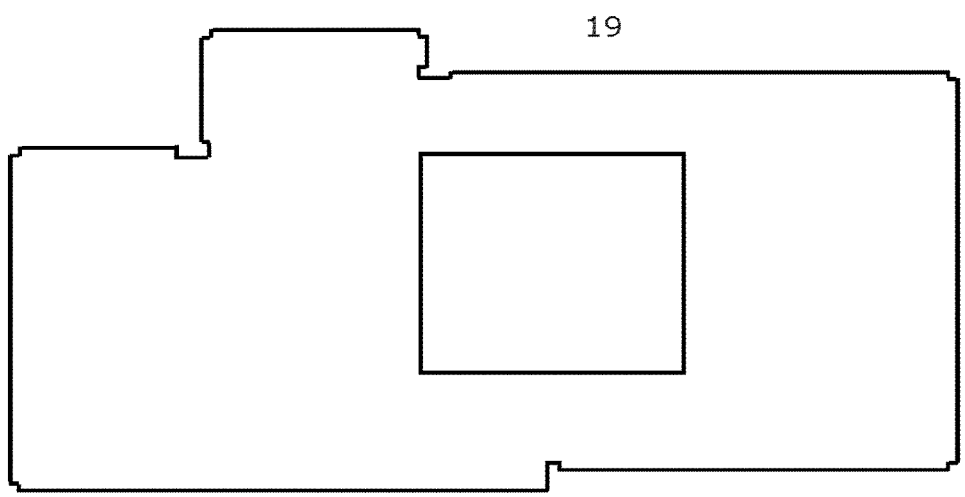
FIG. 5 is a cover component viewed from above.
Figure 8:
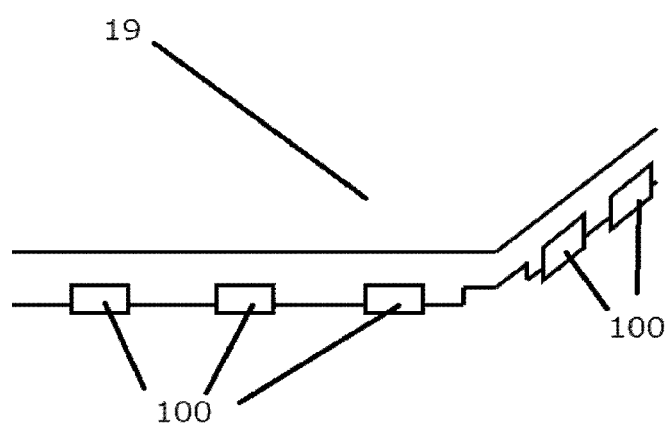
FIG. 8 is a view illustrating a process of placing the cover component.

Cover component 19 used in the embodiment is made, for example, of metal, such as a copper alloy or an aluminum alloy, and as illustrated in FIGS. 5 and 8, is a substantially rectangular plate with an engaging portion corresponding to the clips 100 bent around the edge.

Figure 7:
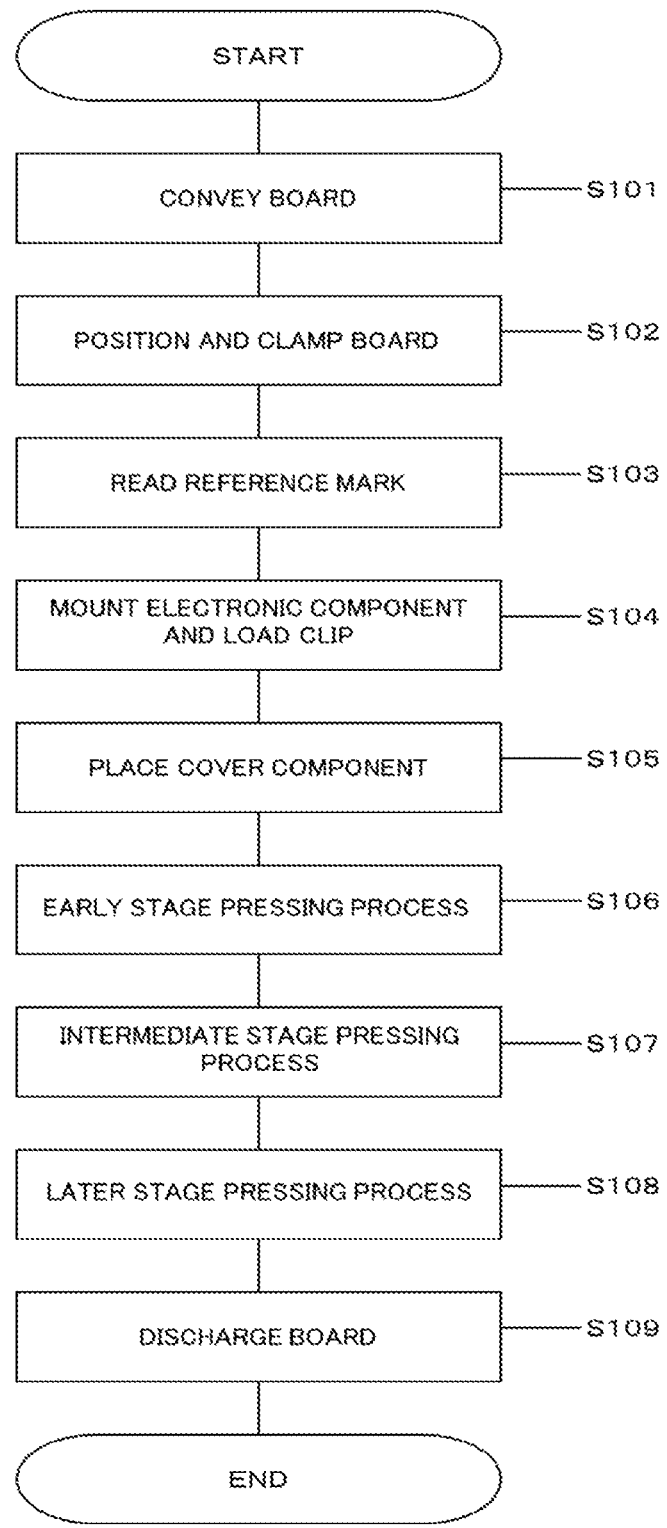
FIG. 7 is a flowchart illustrating a procedure for assembling the cover component to the board.

A procedure for covering electronic component 40 mounted on board 3 with cover component 19 by using the electronic component mounting device 2 which is configured as described above will be described hereinafter, based on the flowchart of FIG. 7.

To describe the process in detail, control device 18 conveys board 3 into the electronic component mounting device 2, and conveys board 3 to a predetermined conveying position by board conveyance device 4 (S101).

Board 3 conveyed to the predetermined conveying position is raised to a mounting position from the predetermined conveying position by the raising and lowering device which is not illustrated, positioned, and clamped by the clamping device which is not illustrated (process of conveying and positioning the board, S102).

Figure 6:
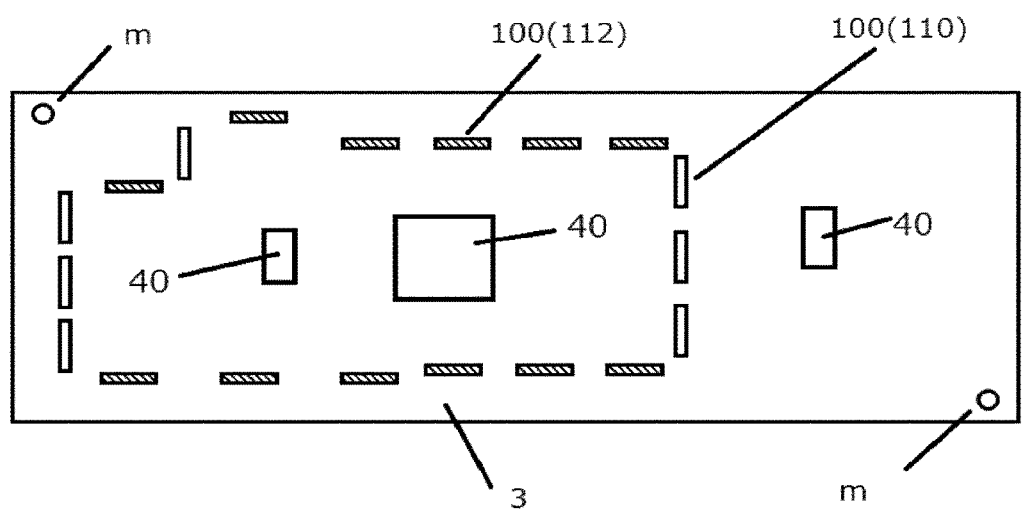
FIG. 6 is a view illustrating the positional relationship between a board on which the clip is loaded and reference marks.

Next, as illustrated in FIG. 6, control device 18 positions mark recognition camera 14 to one pair of reference marks m provided at corners on a diagonal line of the positioned board 3, and reads position coordinates of the reference mark m (S103). Accordingly, by comparing data of the position coordinates of the board 3 stored in a storage device of control device 18 in advance, the positional shift in a horizontal direction (the X direction, the Y direction, and a rotating direction) of the position at which the board 3 is positioned by the board conveyance device 4 is recognized.

Next, control device 18 picks up electronic component 40 from cassette type feeder 21 by suction nozzle 28, and mounts the electronic component 40 on the board 3 at the position-corrected position coordinates. In addition, clip 100 is picked up from cassette type feeder 21 by suction nozzle 28, and the clip 100 is loaded on the board 3 at the position-corrected position coordinates (process of mounting the component and loading the clip, S104). In general, the order of mounting and loading electronic component 40 and clip 100 is determined according to efficiency.

Next, as illustrated in FIGS. 6 and 8, after completely finishing at least the mounting of electronic components scheduled to be covered by cover component 19 and the loading of clip 100 to be engaged with the cover component 19, control device 18 picks up cover component 19 by suction nozzle 30, and places cover component 19 on the board 3 at the position-corrected position coordinates. (Process of placing the cover component, S105.)

Figure 9:
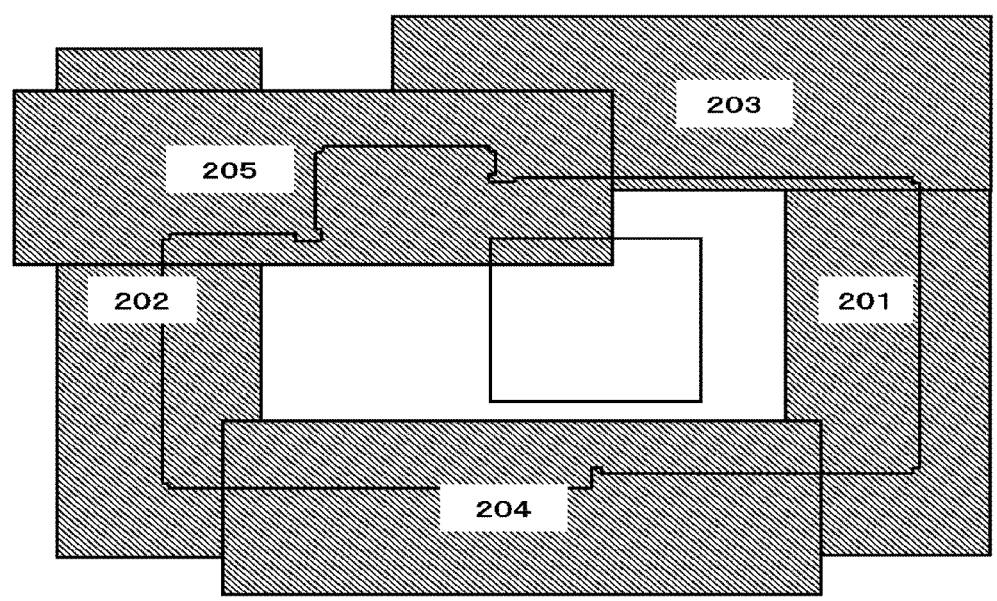
FIG. 9 is a view illustrating an order of pushing an upper surface of the cover component by a pressing portion.
Figure 10:
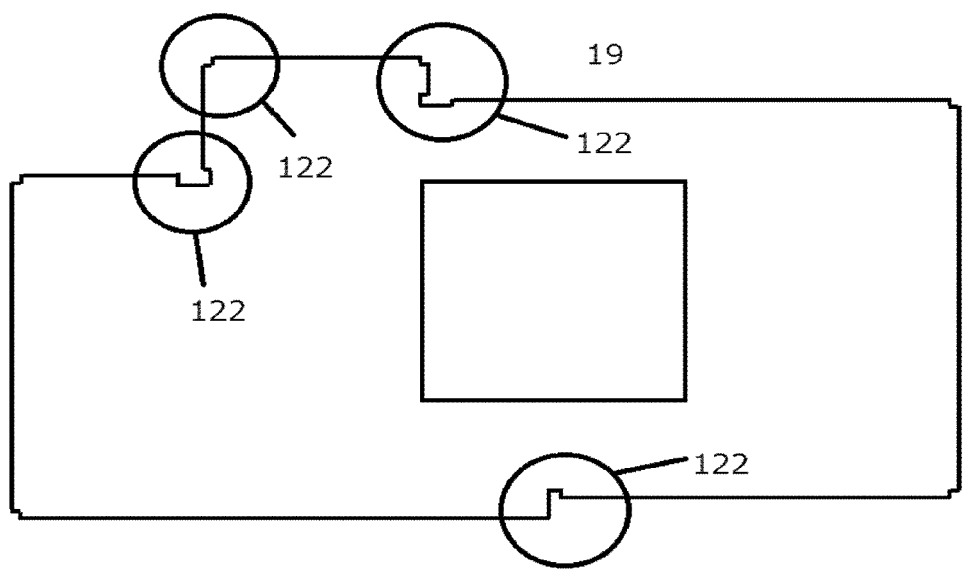
FIG. 10 is a view illustrating angular portions when the cover component is viewed from above.

Next, as illustrated in FIG. 9, control device 18 presses one of the opposing engaging portions of cover component 19 positioned below pressing portion 201 in a lateral direction by raising the suction nozzle 30 to be above the cover component 19 and lowering the suction nozzle 30 (early stage pressing process, S106). Here, it is better if the size of suction nozzle 30 is such that suction nozzle 30 completely covers one of the opposing engaging portions in the lateral direction. With this size, it is possible to prevent cover component 19 from being disengaged. Next, as illustrated in FIG. 9, control device 18 presses another opposing engaging portion of cover component 19 positioned below pressing portion 202 in a lateral direction by moving and lowering the suction nozzle 30 after raising the suction nozzle 30 (intermediate stage pressing process, S107). After this, as illustrated in FIG. 9, control device 18 controls suction nozzle 30 in order of pressing portions 201, 202, 203, 204, and 205 to press all of the multiple engaging portions of cover component 19.

There are cases where, for the engaging portions positioned at angular portions 122 which are not any of the four corners of cover component 19, the engaging portion changes from an engaged state to a disengaged state by another position being pressed. Therefore, such engaging portions should be pressed (pressing portions 204, 205) during the second half of a process of pressing and assembling (later stage pressing process, S108).

Next, control device 18 delivers board 3 to the board conveyance device 4 by unclamping board 3 assembled with cover component 19 and lowering board 3 from the mounting position to the conveying position by the raising and lowering device (S109).

Next, control device 18 drives board conveyance device 4 and discharges board 3 assembled with cover component 19 to the next process (S109).

Since multiple clip 100 are present, there are cases where the position, of each of the clips 100 is shifted from a predetermined position. In this case, it is possible to prevent disengagement by recognizing the shifted position and correcting in the direction of the shift to the predetermined placing position of cover component 19. In the embodiment, the positions of two or more clips 100 are gauged with mark recognition camera 14, the positions are stored, and the positioning is corrected. In particular, for correcting the position to the predetermined placing position in the longitudinal direction of cover component 19, among the multiple clips 100, it is effective to select and use a clip in which cover component-oriented opening portion 101 is open in the longitudinal direction, that is, to select and use a part or the entirety of clip longitudinal direction positioning reference group 110 which is not hatched in the drawing. In addition, for correcting the position to the predetermined placing position in the lateral direction, among the multiple clips 100, it is effective to select and use a clip in which cover component-oriented opening portion 101 is opened in the lateral direction, that is, to select and use a part or the entirety of clip lateral direction positioning reference group 112 which is hatched in the drawing. In other words, for correcting the position of cover component 19 to the predetermined placing position, the position-correcting is performed by clip longitudinal direction positioning reference group 110 and clip lateral direction positioning reference group 112. This process is performed before S105.

Figure 11:
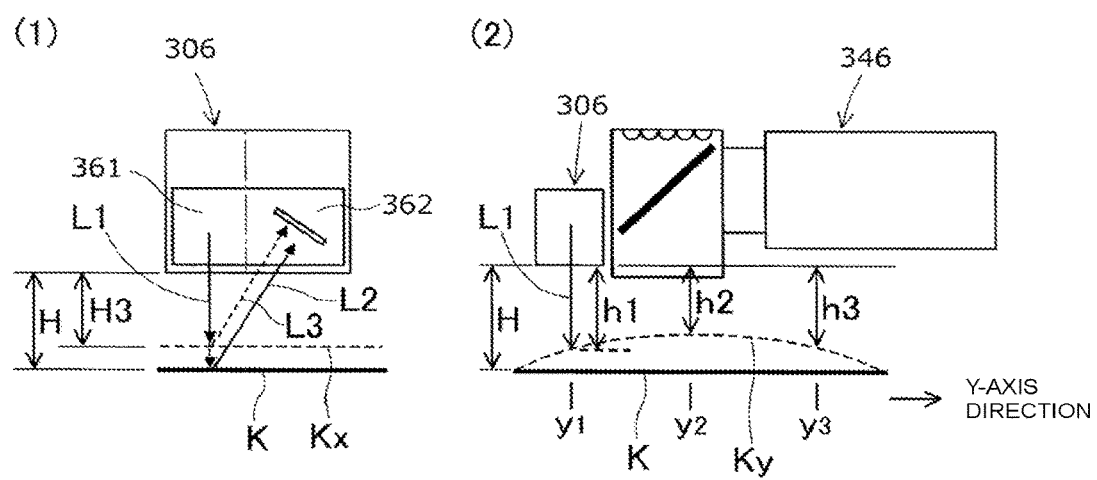
FIG. 11 is a view illustrating a mark recognition camera provided with a height measurement function.

Here, board camera 346 will be described. As illustrated in FIG. 11(1), laser height sensor 306 has laser light emitting portion 361 and reflected light detection portion 362 which are disposed adjacent to each other. Laser light emitting portion 361 emits laser light L1 in a downward direction toward board K which is a target disposed below. Laser light L1 is reflected by the upper surface of board K, and reflected laser light L2 hits the reflected light detection portion 362. Reflected light detection portion 362 detects height H of the target from the difference of the detected position of the reflected laser light L2. In FIG. 11(1), reflected laser light L2 in a case where board K has regular height H, and reflected laser light L3 in a case where board Kx has height H3 which is higher than the regular height, are described as examples.

In addition, as illustrated in FIG. 11(2), the target of measurement of height by laser height sensor 306 is an upper surface of board K, and height measurement is performed at multiple measurement positions. In FIG. 11(2), measurement positions of three locations y1, y2, and y3 in a Y-axis direction of board K are described as examples. In reality, the height measurement is performed by using a total of nine lattice points on board K as measurement positions in consideration of three locations in an X-axis direction. In this case, when board K is flat and maintains a horizontal posture, the same height H is measured at all of the measurement positions. In addition, as illustrated by a dashed line in FIG. 11(2), on curved board Kx, heights h1 to h3 which are different from each other are measured at each measurement position. In addition, heights which are different from each other are measured at each measurement position also in a case where board K does not have a horizontal posture and is clamped being inclined. Note that, the total of nine measurement positions is an example, and it is possible to set any number of measurement positions using coordinate values of a plane coordinate system on the head driving mechanism.

As multiple clips 100 are present, there is a possibility of discharging to the next process in a state where at least a part of the clips is disengaged, or in a state where the clips are changed to disengaged from an engaged state (S109). In order to prevent this, it is possible to add a process of inspecting whether there is a problem with the engaging portions after completing the process of pressing and assembling the cover component 19. In the embodiment, instead of mark recognition camera 14, a height measurement function of board camera 346 illustrated in FIG. 11 and provided in electronic component mounting device 2 is used. It is possible to inspect whether all of the engaging portions of cover component 19 are engaged by measuring the height at one or more locations on the upper surface of cover component 19 by the function, storing the height in the storage device (not illustrated), and confirming whether the height is lower than a predetermined value by a determination device (not illustrated). In order to acquire more accurate height measurement, the heights at three or more locations on the upper surface may be measured. In general, it is considered that the process is performed after S108, but may be performed between S106 and S108.

According to a method of assembling the cover component by using electronic component mounting device 2 configured as described above, it is possible to provide a space-saving electronic component mounting device having high efficiency.

According to a method of assembling the cover component by using electronic component mounting device 2 configured as described above, it is possible to prevent disengagement, and to produce cover components which are reliably engaged.

In addition, in the above-described embodiment, one of the two vertical motion members is suction nozzle 28, and the other one of the two vertical motion members is suction nozzle 30. However, the number of vertical motion members is not limited to two, and for example, may be one or may be three or more.

In addition, in the above-described embodiment, clip 100 is an engaged member, but the clip-shaped engaging portion may be on cover component 19, and there are also cases where the shapes of each of the clips 100 are different from each other with respect to the multiple engaged portions. In addition, clip 100 may be supplied from component tray 17, and cover component 19 may be supplied from cassette type feeder 21.

In addition, in the above-described embodiment, the number of electronic component mounting devices 2 is assumed to be one, but may be a plural number.

Furthermore, in the above-described embodiment, the height of the upper surface of cover component 19 is measured by the height function of board camera 346, but the height may be measured by laser or by contact. The specific configuration described in the above-described embodiment is merely an example of the disclosure. The disclosure is not limited to the specific configuration, and can employ various aspects without departing from the main idea of the disclosure.

REFERENCE SIGNS LIST

2: electronic component mounting device, 3: board, 4: board conveyance device, 5: component supply device, 12: component transfer device, 14: mark recognition camera, 19: cover component, 24: vertical motion member (nozzle holder), 26: vertical motion member (nozzle holder), 28: vertical motion member (suction nozzle), 30: vertical motion member (suction nozzle), 32: pressing portion, 34: negative pressure source, 36: negative pressure flow path, 40: electronic component, 100: clip, 101: cover component-oriented opening portion, 102: cover component nipping portion, 103: board loading surface, 110: clip longitudinal direction positioning reference group, 112: clip lateral direction positioning reference group, 122: angular portion, 201: pressing portion, 202: pressing portion, 203: pressing portion, 204: pressing portion, 205: pressing portion, 346: board camera, 306: laser height sensor, 361: laser light emitting portion, 362: reflecting light detection portion, L1: laser light, L2: reflected laser light, L3: reflected laser light, K: board, Kx: board, Ky: board, H: height, H3: height, h1: height, h2: height, h3: height

The invention claimed is:
1. An electronic component mounting device, comprising:
a board conveyance device which conveys and positions a board on which an electronic component is mounted;
a mounting device which positions and mounts the electronic component to a mounting position of the board;
a loading device which picks up multiple engaged members, and positions and loads the engaged members to a loading position of the board;
a placing device which picks up a cover component that covers the mounted electronic component, the cover component is provided with an engaging portion at a predetermined position, and the placing device positions and places the cover component to a position such that the engaging portion corresponds to the engaged member;
a selection device which selects two or more engaged members from the multiple engaged members loaded on the board;
a gauging device which gauges a loading position of the selected two or more engaged members;
a position storage device which stores a gauging result of the loading position of the selected two or more engaged members by the gauging device; and
a correction device which corrects a placing position of the cover component based on the gauging result.
2. The electronic component mounting device according to claim 1, further comprising:
a vertical motion device which includes a pressing portion that presses the cover component; and
a control device which drives the vertical motion device, and presses the cover component by the pressing portion multiple times.
3. The electronic component mounting device according to claim 2,
wherein the cover component includes multiple engaging portions; and
wherein the control device presses all of the multiple engaging portions of the cover component.
4. The electronic component mounting device according to claim 2,
wherein the control device presses a part including an angular portion which is not any of four corners of the cover component for a second half of multiple times of pressing.
5. The electronic component mounting device according to claim 2,
wherein the pressing portion is provided on a nozzle which picks up the electronic component, and
wherein a lower end surface of the nozzle has a flat surface for pressing.
6. The electronic component mounting device according to claim 2, further comprising:
a measurement device which measures a height of the cover component;
a height storage device which stores a measurement result of the height of the cover component measured by the measurement device; and
a determination device which determines whether the pressing has been performed acceptably based on the measurement result.
7. An electronic component mounting device, comprising:
a board conveyance device which is configured to convey and position a board on which an electronic component is mounted;

a mounting device which positions and mounts the electronic component to a mounting position of the board;

a loading device which picks up multiple engaged members and positions and loads the engaged members to a loading position of the board;

a placing device which picks up a cover component that covers the mounted electronic component; the cover component is provided with an engaging portion at a predetermined position, and the placing device positions and places the cover component to a position such that the engaging portion corresponds to the engaged member;

a vertical motion device which includes a pressing portion which presses the cover component;

a control device which drives the vertical motion device, and presses the cover component by the pressing portion multiple times;

a measurement device which measures a height of the board and measures a height of the cover component;

a height storage device which is configured to store measurement results of heights of multiple predetermined positions of the cover component measured by the measurement device and measurement results of heights of multiple predetermined positions of the board measured by the measurement device; and a determination device which determines whether the pressing of the cover component has been performed acceptably based on the measurement results of the heights of the multiple predetermined positions of the cover component and the heights of the multiple predetermined positions of the board.

* * * * *